(12) United States Patent
Chang Chien et al.

(10) Patent No.: US 8,237,250 B2
(45) Date of Patent: Aug. 7, 2012

(54) ADVANCED QUAD FLAT NON-LEADED PACKAGE STRUCTURE AND MANUFACTURING METHOD THEREOF

(75) Inventors: Pao-Huei Chang Chien, Kaohsiung County (TW); Ping-Cheng Hu, Kaohsiung (TW); Po-Shing Chiang, Kaohsiung County (TW); Wei-Lun Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 313 days.

(21) Appl. No.: 12/425,635

(22) Filed: Apr. 17, 2009

(65) Prior Publication Data
US 2010/0044843 A1    Feb. 25, 2010

Related U.S. Application Data

(60) Provisional application No. 61/090,879, filed on Aug. 21, 2008.

(51) Int. Cl.
*H01L 23/495* (2006.01)
*H01L 23/48* (2006.01)
*H01L 23/52* (2006.01)
*H01L 29/40* (2006.01)

(52) U.S. Cl. ........ 257/676; 257/669; 257/672; 257/674; 257/692; 257/773; 257/E21.506; 257/E23.01; 257/E23.032; 257/E23.141

(58) Field of Classification Search .................. 257/676, 257/784, 672, 674, 690, 692, 773, 776, E23.141, 257/666, 669, 670, 693, 775, E21.506, E23.01, 257/E23.032
See application file for complete search history.

(56) References Cited

U.S. PATENT DOCUMENTS

| 5,200,025 | A | | 4/1993 | Toei et al. |
| 5,389,739 | A | | 2/1995 | Mills |
| 5,656,550 | A | | 8/1997 | Tsuji et al. |
| 5,800,958 | A | | 9/1998 | Manteghi |
| 5,804,468 | A | * | 9/1998 | Tsuji et al. ............... 438/122 |
| 5,847,458 | A | | 12/1998 | Nakamura et al. |
| 5,900,676 | A | | 5/1999 | Kweon et al. |
| 5,969,412 | A | | 10/1999 | Matsutomo |
| 6,001,671 | A | | 12/1999 | Fjelstad |
| 6,093,584 | A | | 7/2000 | Fjelstad |

(Continued)

FOREIGN PATENT DOCUMENTS
CN   1726591   1/1996
(Continued)

OTHER PUBLICATIONS

Lin et al., U.S. Appl. No. 12/405,043, filed Mar. 16, 2009. Office Action mailed Aug. 5, 2010.

(Continued)

*Primary Examiner* — Teresa M Arroyo
(74) *Attorney, Agent, or Firm* — Foley & Lardner LLP

(57) ABSTRACT

The advanced quad flat non-leaded package structure includes a carrier, a chip, a plurality of wires, and a molding compound. The carrier includes a die pad and a plurality of leads. The leads include first leads disposed around the die pad, second leads disposed around the first leads and at least an embedded lead portion between the first leads and the second leads. The wires are disposed between the chip, the first leads and the embedded lead portion. The advanced quad flat non-leaded package structures designed with the embedded lead portion can provide better electrical connection.

20 Claims, 11 Drawing Sheets

U.S. PATENT DOCUMENTS

| | | | |
|---|---|---|---|
| 6,097,098 A * | 8/2000 | Ball | 257/786 |
| 6,132,593 A | 10/2000 | Tan | |
| 6,191,494 B1 | 2/2001 | Ooyama et al. | |
| 6,201,292 B1 | 3/2001 | Yagi et al. | |
| 6,229,205 B1 | 5/2001 | Jeong et al. | |
| 6,238,952 B1 | 5/2001 | Lin | |
| 6,242,284 B1 | 6/2001 | Kang et al. | |
| 6,261,864 B1 | 7/2001 | Jung et al. | |
| 6,291,271 B1 | 9/2001 | Lee et al. | |
| 6,303,985 B1 | 10/2001 | Larson et al. | |
| 6,306,685 B1 | 10/2001 | Liu et al. | |
| 6,333,252 B1 | 12/2001 | Jung et al. | |
| 6,342,730 B1 | 1/2002 | Jung et al. | |
| 6,358,778 B1 * | 3/2002 | Shinohara | 438/123 |
| 6,410,987 B1 | 6/2002 | Kanemoto et al. | |
| 6,424,047 B1 | 7/2002 | Chua et al. | |
| 6,429,536 B1 | 8/2002 | Liu et al. | |
| 6,451,627 B1 | 9/2002 | Coffman | |
| 6,495,909 B2 | 12/2002 | Jung et al. | |
| 6,498,099 B1 | 12/2002 | McLellan et al. | |
| 6,501,162 B2 | 12/2002 | Sakamoto et al. | |
| 6,525,406 B1 | 2/2003 | Chung et al. | |
| 6,528,879 B2 | 3/2003 | Sakamoto et al. | |
| 6,528,893 B2 | 3/2003 | Jung et al. | |
| 6,545,347 B2 | 4/2003 | McClellan | |
| 6,548,328 B1 | 4/2003 | Sakamoto et al. | |
| 6,551,859 B1 | 4/2003 | Lee et al. | |
| 6,562,660 B1 | 5/2003 | Sakamoto et al. | |
| 6,580,159 B1 * | 6/2003 | Fusaro et al. | 257/668 |
| 6,585,905 B1 | 7/2003 | Fan et al. | |
| 6,586,677 B2 | 7/2003 | Glenn | |
| 6,635,956 B2 | 10/2003 | Sakamoto et al. | |
| 6,635,957 B2 | 10/2003 | Kwan et al. | |
| 6,650,020 B2 * | 11/2003 | Yamada et al. | 257/783 |
| 6,683,368 B1 | 1/2004 | Mostafazadeh | |
| 6,689,640 B1 | 2/2004 | Mostafazadeh | |
| 6,700,188 B2 | 3/2004 | Lin | |
| 6,706,547 B2 | 3/2004 | Sakamoto et al. | |
| 6,713,849 B2 | 3/2004 | Hasebe et al. | |
| 6,740,961 B1 | 5/2004 | Mostafazadeh | |
| 6,759,271 B2 | 7/2004 | Miyazaki | |
| 6,762,118 B2 * | 7/2004 | Liu et al. | 438/613 |
| 6,777,789 B1 | 8/2004 | Glenn et al. | |
| 6,812,063 B2 | 11/2004 | Huang | |
| 6,812,410 B2 | 11/2004 | Sakamoto et al. | |
| 6,812,552 B2 | 11/2004 | Islam et al. | |
| 6,818,973 B1 * | 11/2004 | Foster | 257/676 |
| 6,846,704 B2 | 1/2005 | Paek | |
| 6,861,295 B2 | 3/2005 | Jung et al. | |
| 6,861,734 B2 | 3/2005 | Minamio et al. | |
| 6,927,483 B1 | 8/2005 | Lee et al. | |
| 6,933,594 B2 | 8/2005 | McLellan et al. | |
| 6,946,324 B1 | 9/2005 | McLellan et al. | |
| 6,975,022 B2 | 12/2005 | Sakamoto et al. | |
| 6,975,038 B1 | 12/2005 | Mostafazadeh | |
| 6,984,880 B2 | 1/2006 | Minamio et al. | |
| 6,995,459 B2 | 2/2006 | Lee et al. | |
| 6,995,460 B1 | 2/2006 | McLellan et al. | |
| 7,009,286 B1 * | 3/2006 | Kirloskar et al. | 257/684 |
| 7,026,190 B2 | 4/2006 | Kobayashi et al. | |
| 7,049,177 B1 * | 5/2006 | Fan et al. | 438/123 |
| 7,060,535 B1 | 6/2006 | Sirinorakul et al. | |
| 7,087,462 B1 * | 8/2006 | Park et al. | 438/112 |
| 7,091,606 B2 | 8/2006 | Sakamoto et al. | |
| 7,095,100 B2 | 8/2006 | Kasuya | |
| 7,125,798 B2 | 10/2006 | Sakamoto et al. | |
| 7,129,116 B2 | 10/2006 | Islam et al. | |
| 7,145,222 B2 | 12/2006 | Gai | |
| 7,166,495 B2 | 1/2007 | Ball | |
| 7,173,336 B2 | 2/2007 | Sakamoto et al. | |
| 7,193,302 B2 | 3/2007 | Tseng | |
| 7,208,826 B2 | 4/2007 | Sakamoto et al. | |
| 7,215,009 B1 | 5/2007 | Leng et al. | |
| 7,226,811 B1 | 6/2007 | McLellan et al. | |
| 7,235,888 B2 | 6/2007 | Hosokawa et al. | |
| 7,247,526 B1 * | 7/2007 | Fan et al. | 438/123 |
| 7,247,938 B2 | 7/2007 | Groenhuis et al. | |
| 7,262,491 B2 | 8/2007 | Islam et al. | |
| 7,271,032 B1 | 9/2007 | McLellan et al. | |
| 7,301,225 B2 | 11/2007 | Wong et al. | |
| 7,344,920 B1 | 3/2008 | Kirloskar et al. | |
| 7,348,663 B1 | 3/2008 | Kirloskar et al. | |
| 7,351,612 B2 | 4/2008 | Gai | |
| 7,382,044 B1 | 6/2008 | Yilmaz et al. | |
| 7,407,834 B2 | 8/2008 | Shimanuki et al. | |
| 7,410,834 B2 | 8/2008 | Fukaya et al. | |
| 7,443,012 B2 | 10/2008 | Yamaguchi | |
| 7,446,397 B2 | 11/2008 | Gai | |
| 7,459,347 B2 | 12/2008 | Shimanuki et al. | |
| 7,494,557 B1 | 2/2009 | Peterson | |
| 7,518,156 B2 | 4/2009 | Hasebe et al. | |
| 7,550,322 B2 | 6/2009 | Kimura | |
| 7,563,648 B2 | 7/2009 | Islam et al. | |
| 7,598,606 B2 | 10/2009 | Chow et al. | |
| 7,608,482 B1 | 10/2009 | Bayan | |
| 7,622,332 B2 | 11/2009 | Islam et al. | |
| 7,679,172 B2 | 3/2010 | Huang et al. | |
| 7,683,461 B2 | 3/2010 | Lau | |
| 7,786,557 B2 | 8/2010 | Hsieh et al. | |
| 7,790,500 B2 | 9/2010 | Ramos et al. | |
| 7,799,611 B2 | 9/2010 | Ramos et al. | |
| 7,834,469 B2 | 11/2010 | Chuang et al. | |
| 2001/0052600 A1 | 12/2001 | Sakamoto et al. | |
| 2002/0109214 A1 * | 8/2002 | Minamio et al. | 257/676 |
| 2002/0160552 A1 | 10/2002 | Minamio et al. | |
| 2002/0163015 A1 | 11/2002 | Lee et al. | |
| 2003/0071333 A1 | 4/2003 | Matsuzawa | |
| 2003/0092205 A1 | 5/2003 | Wu et al. | |
| 2003/0170922 A1 | 9/2003 | Sakamoto et al. | |
| 2003/0203539 A1 | 10/2003 | Islam et al. | |
| 2004/0046237 A1 | 3/2004 | Abe et al. | |
| 2004/0094829 A1 | 5/2004 | Minamio et al. | |
| 2004/0217450 A1 | 11/2004 | Li et al. | |
| 2005/0006737 A1 | 1/2005 | Islam et al. | |
| 2005/0023667 A1 | 2/2005 | Lin et al. | |
| 2005/0133892 A1 * | 6/2005 | Fujimoto et al. | 257/676 |
| 2005/0146058 A1 | 7/2005 | Danno | |
| 2006/0033184 A1 * | 2/2006 | Park et al. | 257/666 |
| 2006/0055009 A1 * | 3/2006 | Shim et al. | 257/666 |
| 2006/0240600 A1 | 10/2006 | Ito et al. | |
| 2007/0018291 A1 * | 1/2007 | Huang et al. | 257/676 |
| 2007/0052070 A1 | 3/2007 | Islam et al. | |
| 2007/0052076 A1 | 3/2007 | Ramos et al. | |
| 2007/0059863 A1 | 3/2007 | Li et al. | |
| 2007/0085199 A1 | 4/2007 | Ong et al. | |
| 2007/0126094 A1 * | 6/2007 | Shojaie et al. | 257/676 |
| 2007/0141756 A1 | 6/2007 | Iitani et al. | |
| 2007/0164403 A1 | 7/2007 | Huang et al. | |
| 2007/0164411 A1 | 7/2007 | Huang et al. | |
| 2007/0181983 A1 | 8/2007 | Takai et al. | |
| 2007/0194417 A1 | 8/2007 | Yoshida et al. | |
| 2007/0222040 A1 * | 9/2007 | Lin | 257/666 |
| 2008/0029855 A1 | 2/2008 | Chang | |
| 2008/0061414 A1 * | 3/2008 | Retuta et al. | 257/676 |
| 2008/0067649 A1 | 3/2008 | Matsunaga et al. | |
| 2008/0079124 A1 | 4/2008 | Haga et al. | |
| 2008/0093715 A1 | 4/2008 | Lange et al. | |
| 2008/0102563 A1 * | 5/2008 | Lange et al. | 438/113 |
| 2008/0179758 A1 | 7/2008 | Wong et al. | |
| 2008/0258278 A1 * | 10/2008 | Ramos et al. | 257/676 |
| 2008/0311705 A1 | 12/2008 | Kim | |
| 2009/0001540 A1 | 1/2009 | Yang et al. | |
| 2009/0065914 A1 | 3/2009 | Engl | |
| 2009/0127682 A1 | 5/2009 | Kim et al. | |
| 2009/0152691 A1 | 6/2009 | Nguyen et al. | |
| 2009/0189260 A1 | 7/2009 | Hasebe et al. | |
| 2009/0230523 A1 | 9/2009 | Chien et al. | |
| 2009/0230524 A1 | 9/2009 | Chien et al. | |
| 2009/0230525 A1 | 9/2009 | Chien et al. | |
| 2009/0230526 A1 | 9/2009 | Chen et al. | |
| 2009/0267210 A1 | 10/2009 | Chuang | |
| 2009/0278243 A1 | 11/2009 | Chuang | |
| 2009/0283882 A1 | 11/2009 | Hsieh et al. | |
| 2010/0044850 A1 | 2/2010 | Lin et al. | |
| 2010/0258920 A1 | 10/2010 | Chien et al. | |

| | | | |
|---|---|---|---|
| 2010/0258921 | A1 | 10/2010 | Chien et al. |
| 2010/0258934 | A1 | 10/2010 | Chien et al. |
| 2011/0163430 | A1 | 7/2011 | Lee et al. |

FOREIGN PATENT DOCUMENTS

| | | |
|---|---|---|
| CN | 2726111 | 9/2005 |
| CN | 1735963 | 2/2006 |
| CN | 1985371 | 6/2007 |
| CN | 101442035 | 5/2009 |
| CN | 101540309 | 9/2009 |
| CN | 101587868 | 11/2009 |
| CN | 101252096 | 8/2010 |
| CN | 101273452 | 11/2010 |
| JP | 05166985 | 7/1993 |
| JP | 11195733 | 7/1999 |
| JP | 2001024135 | 1/2001 |
| JP | 2005317998 | 11/2005 |

OTHER PUBLICATIONS

Lee et al., U.S. Appl. No. 12/683,426, filed Jan. 6, 2010 for "Leadframe Structure, Advanced Quad Flat No Lead Package Structure Using the Same and Manufacturing Methods Thereof."

Lin et al., U.S. Appl. No. 12/405,043, filed Mar. 16, 2009 for "Advanced Quad Flat Non-Leaded Package Structure and Manufacturing Method Thereof." Office Action mailed Jan. 7, 2011.

Chien et al., U.S. Appl. No. 12/192,702, filed Aug. 15, 2008 for "Advanced Quad Flat No Lead Chip Package Having a Cavity Structure and Manufacturing Methods Thereof." Office Actions mailed Nov. 17, 2010; Mar. 31, 2011; Sep. 29, 2011.

Chien, et al., U.S. Appl. No. 12/192,742, filed Aug. 15, 2008 for "Semiconductor Chip Package Having Ground and Power Regions and Manufacturing Methods Thereof." Office Actions mailed Feb. 8, 2011; Sep. 7, 2011.

Chien et al., U.S. Appl. No. 12/192,761, filed Aug. 15, 2008 for "Advanced Quad Flat No Lead Chip Package Having Marking and Corner Lead Features and Manufacturing Methods Thereof." Office Action mailed Apr. 7, 2011; Notice of Allowance mailed Oct. 13, 2011.

Chen et al., U.S. Appl. No. 12/192,805, filed Aug. 15, 2008 for "Advanced Quad Flat No Lead Chip Package Having a Protective Layer to Enhance Surface Mounting and Manufacturing Methods Thereof." Office Actions mailed May 27, 2010 and Mar. 21, 2011; Notices of Allowance mailed Oct. 29, 2010 and Sep. 8, 2011; Supp. Notice of Allowance mailed Jan. 5, 2012.

Chien et al., U.S. Appl. No. 12/547,787 filed Aug. 26, 2009 for "Manufacturing Method of Advanced Quad Flat Non-Leaded Package." Office Action mailed Jun. 7, 2011; Notice of Allowance mailed Nov. 4, 2011.

Chien et al. U.S. Appl. No. 12/550,645, filed Aug. 31, 2009 for "Advanced Quad Flat Non-Leaded Package Structure and Manufacturing Method Thereof". Office Action mailed Apr. 6, 2011; Notice of Allowance mailed Sep. 22, 2011.

Chien et al. U.S. Appl. No. 12/550,655, filed Aug. 31, 2009 for "Advanced Quad Flat-Leaded Package Structure and Manufacturing Method Thereof". Office Action mailed Dec. 7, 2011.

* cited by examiner

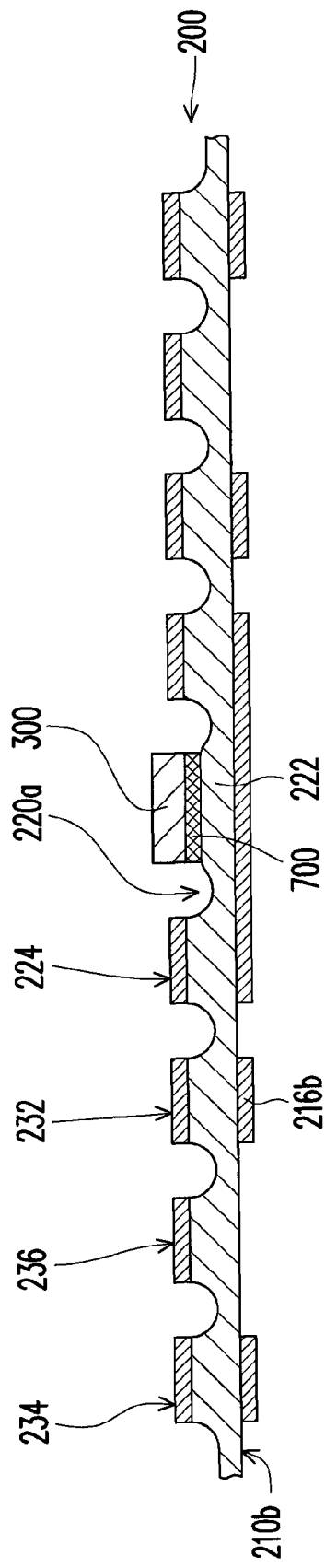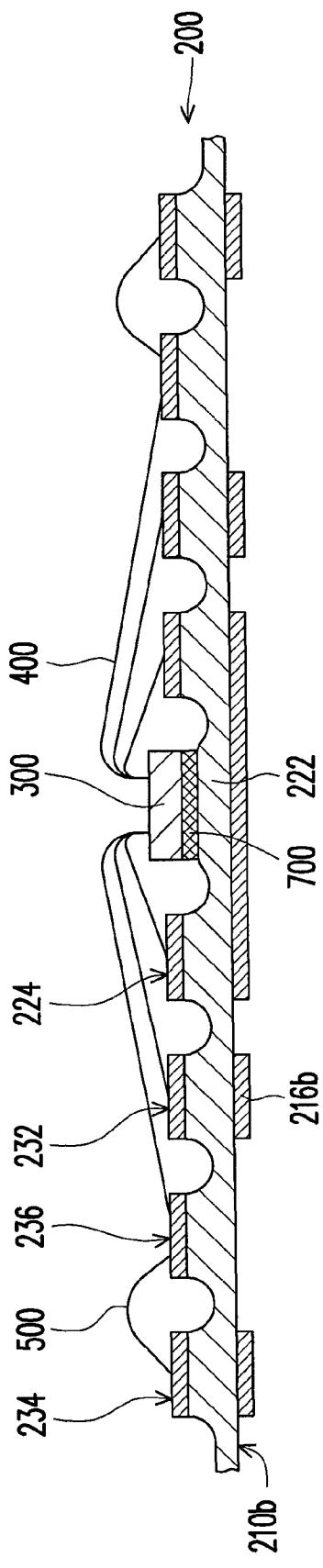

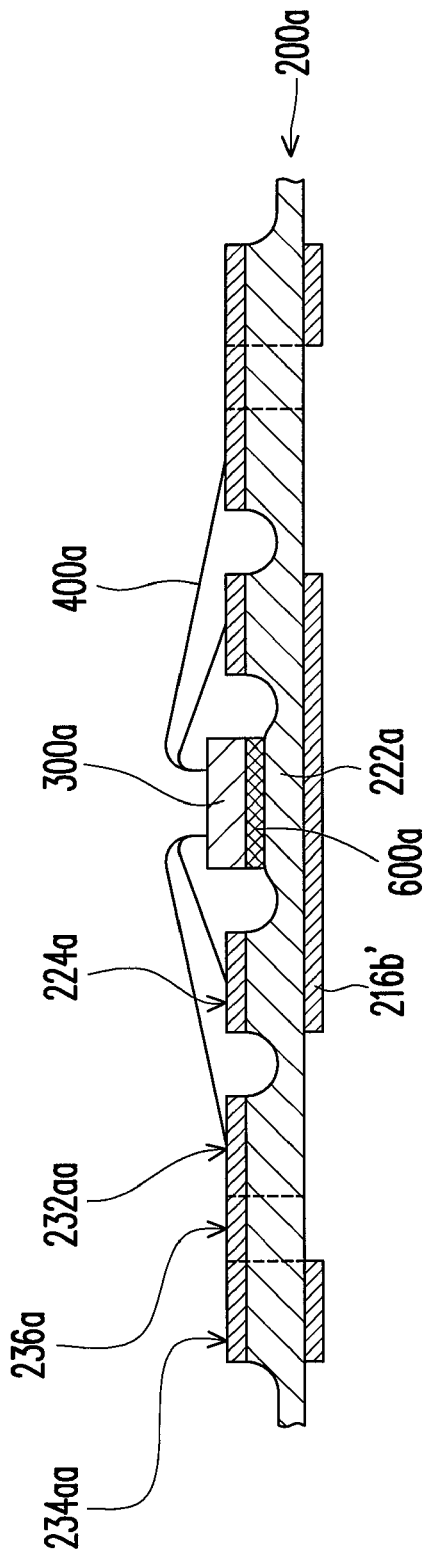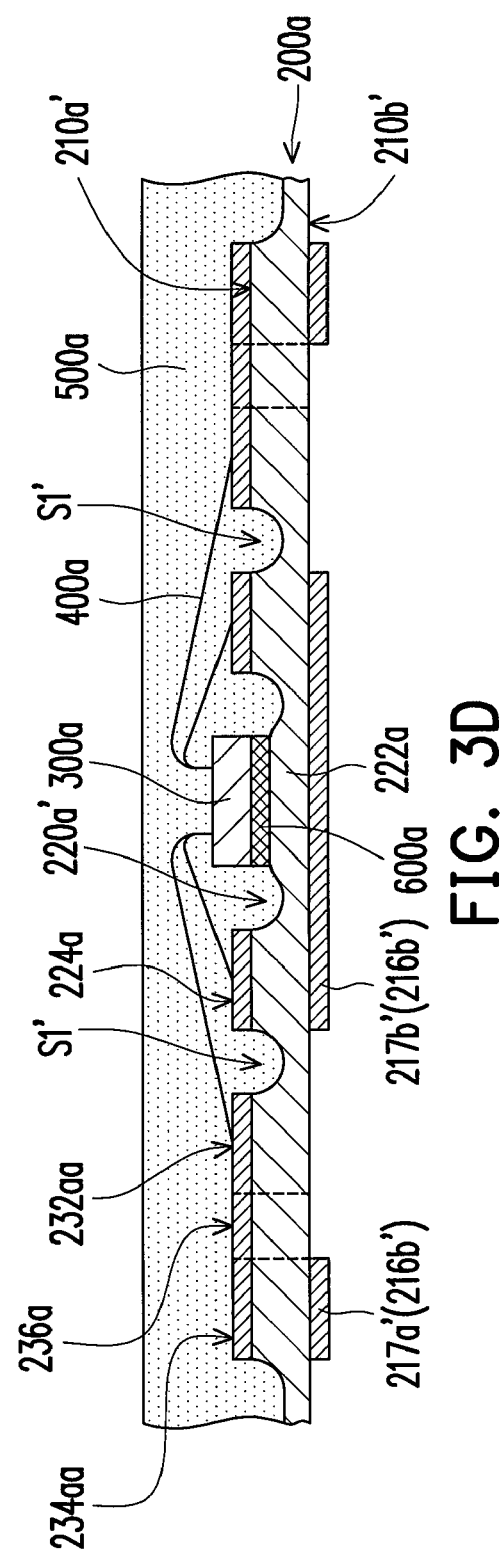

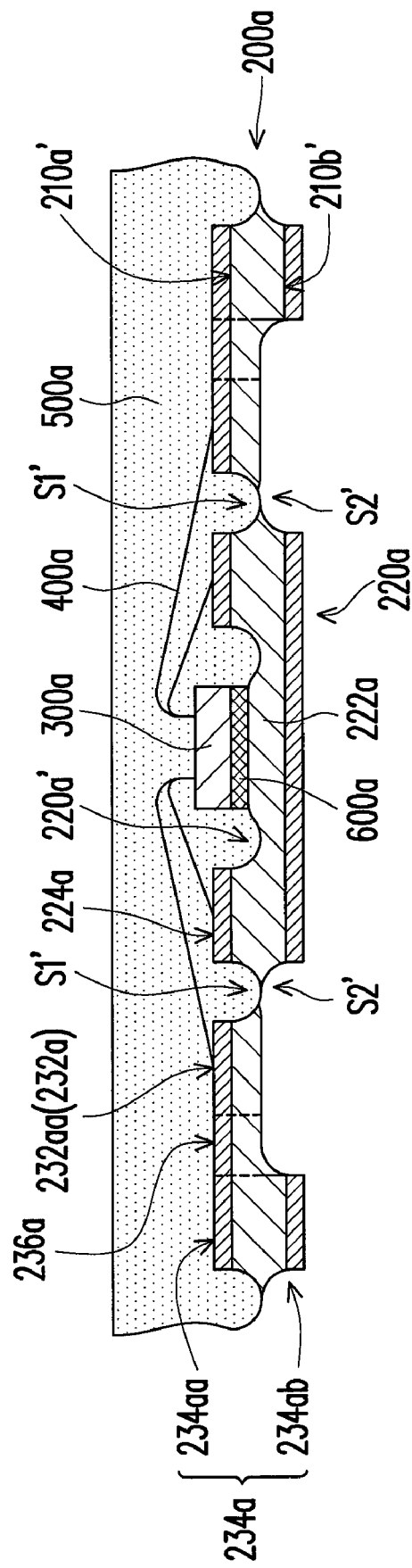

ADVANCED QUAD FLAT NON-LEADED PACKAGE STRUCTURE AND MANUFACTURING METHOD THEREOF

CROSS-REFERENCE TO RELATED APPLICATION

This application claims the priority benefit of U.S.A. provisional application Ser. No. 61/090,879, filed on Aug. 21, 2008. The entirety of the above-mentioned patent application is hereby incorporated by reference herein and made a part of specification.

BACKGROUND OF THE INVENTION

1. Field of the Invention

The present invention generally relates to a package structure and a manufacturing method thereof. More particularly, the present invention relates to an advanced quad flat non-leaded (a-QFN) package structure and manufacturing method thereof.

2. Description of Related Art

A quad flat package (QFP) can be divided as I-type (QFI), J-type (QFJ) and non-lead-type (QFN) packages, according to the shape of the lead for the lead-frames. Since the QFN package structure has relatively shorter signal traces and a faster speed for signal transmission, it has become one popular choice for the package structure with low pin count, and is suitable for the chip package with high-frequency (for example, radio frequency bandwidth) transmission.

In general, in the manufacturing process of the QFN package structure, a plurality of chips is disposed on the leadframe and is electrically connected to the leadframe by means of a plurality of bonding wires. Then, a molding compound is formed to encapsulate the leadframe, the chips and the bonding wires. Finally, a plurality of QFN chip packages is formed through a singulation process.

SUMMARY OF THE INVENTION

The present invention is directed to an advanced quad flat non-leaded package structure and a manufacturing method thereof, which can help lessen cross wire concerns and enhance the product reliability.

The present invention provides an advanced quad flat non-leaded package structure. The advanced quad flat non-leaded package structure includes a carrier, a chip disposed on the carrier, a plurality of wires and a molding compound. The carrier includes a die pad and a plurality of leads, and the leads include a plurality of first leads disposed around the die pad, a plurality of second leads disposed around the first leads and at least an embedded lead portion. The first lead includes a first inner lead and a first portion, while the second lead includes a second inner lead and a second portion. The embedded lead portion is located between the first inner leads and the second inner leads. The wires are disposed between the chip, the first inner leads and the embedded lead portion. The molding compound encapsulates the chip, the die pad, the wires, the first inner leads, the second inner leads and the embedded lead portion.

According to an embodiment of the present invention, the embedded lead portion can be a floating terminal disposed between the first and second inner leads and isolated from the first and second inner leads. Accordingly, the package structure may further include at least a jumper disposed between the floating terminal and one of the second inner leads, so that the chip is electrically connected to the second inner lead through the wire, the floating terminal and the jumper. The material of the jumper can be the same or different from the material of the wires. Alternatively, according to another embodiment of the present invention, the embedded lead portion is a connecting portion that directly connects one of the first inner leads with one of the second inner leads, so that the chip is electrically connected to the second inner lead through the wire and the connecting portion.

According to an embodiment of the present invention, the carrier further comprises at least a ground ring and/or a power ring located on the die pad and electrically connected to the chip through wires. The power ring is electrically isolated from the ground ring.

The present invention further provides a manufacturing method of an advanced quad flat non-leaded package structure, which includes the following steps. The carrier having at least an accommodating cavity, a plurality of first inner leads, a plurality of second inner leads and at least a lead portion defined by a plurality of openings. The first inner leads are disposed around the accommodating cavity, the second inner leads are disposed around the first inner leads, and the lead portion is disposed between the first inner leads and the second inner leads. On the lower surface of the carrier, there are a plurality of first metal portions covering the carrier corresponding to the first inner leads and the second inner leads, and a plurality of second metal portions covering the carrier corresponding to the accommodating cavity. After placing a chip within the accommodating cavity, a plurality of wires is provided. The wires are disposed between the chip, the first inner leads and the lead portion. Then, a molding compound is formed to encapsulate the chip, the wires, the first inner leads, the second inner leads, the lead portion and fill the accommodating cavity and the openings. Afterwards, an etching process is performed using the first and second metal portions on the lower surface of the carrier as an etching mask to etch through the carrier until the molding compound filled inside the openings is exposed, so as to form a plurality of first leads, a plurality of second leads and a die pad.

According to an embodiment of the present invention, when the lead portion is a floating terminal disposed between the first and second inner leads and isolated from the first and second inner leads, the manufacturing method further includes forming at least a jumper disposed between the floating terminal and one of the second inner leads before forming the molding compound, so that the chip is electrically connected to the second inner lead through the wire, the floating terminal and the jumper. The material of the jumper can be the same or different from the material of the wires. Alternatively, when the embedded lead portion is a connecting portion that directly connects one of the first inner leads with one of the second inner leads, the chip is electrically connected to the second inner lead through the wire and the connecting portion.

According to an embodiment of the present invention, before the chip is provided, the method further comprises forming an adhesive layer on the central portion of the accommodating cavity.

In order to make the above and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A through 1H are schematic cross-sectional views illustrating a manufacturing method of an advanced quad flat non-leaded package structure according to an embodiment of the present invention.

FIGS. 3A through 3E are schematic cross-sectional views illustrating a manufacturing method of an advanced quad flat non-leaded package structure according to another embodiment of the present invention.

DESCRIPTION OF THE EMBODIMENTS

Figure 1A:
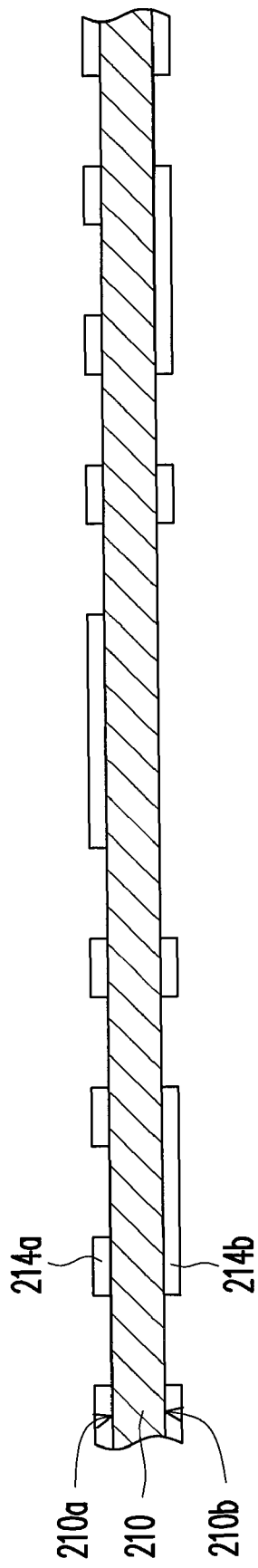

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1H are schematic cross-sectional views illustrating a manufacturing method of an advanced quad flat non-leaded package structure according to an embodiment of the present invention.

As shown in FIG. 1A, a substrate 210 having the upper surface 210a and the lower surface 210b is provided. A material of the substrate 210 is, for example, copper, copper alloy, or other applicable metal material.

Next, still referring to the FIG. 1A, a first patterned photoresist layer 214a is formed on the upper surface 210a of the substrate 210, and a second patterned photoresist layer 214b is formed on the lower surface 210b of the substrate 210. The first patterned photoresist layer 214a exposes a portion of the upper surface 210a of the substrate 210, while the second patterned photoresist layer 214b exposes a portion of the lower surface 210b of the substrate 210. However, the first patterned photoresist layer 214a and the second patterned photoresist layer 214b are asymmetric.

Figure 1B:
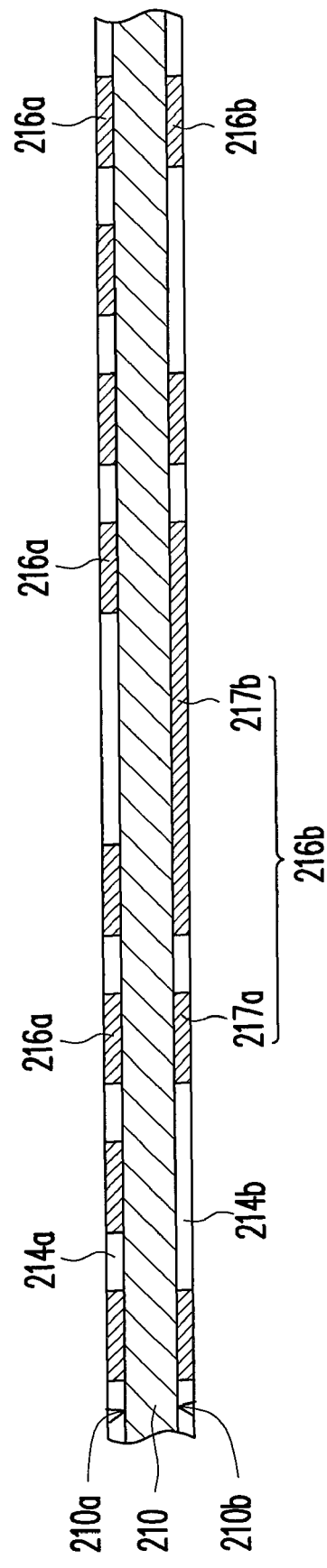

Next, referring to the FIG. 1B, a first metal layer 216a is formed on the exposed portion of the upper surface 210a of the substrate 210 and a second metal layer 216b is formed on the exposed portion of the lower surface 210b of the substrate 210. In the present embodiment, the first metal layer 216a and the second metal layer 216b may be formed by, for example, plating. The first metal layer 216a or the second metal layer 216b described herein may not be a continuous layer, depending on the pattern designs of the first patterned photoresist layer 214a or second patterned photoresist layer 214b.

In more detail, the second metal layer 216b includes a plurality of first metal portion 217a, and at least a second metal portion 217b. The first metal portions 217a correspond to the subsequently to-be-formed first inner leads 232 and second inner leads 234, without the subsequently to-be-formed third inner leads 236, and the second metal portion 217b correspond to the subsequently to-be-formed die pad 220 (as shown in FIG. 1D).

Figure 1C:
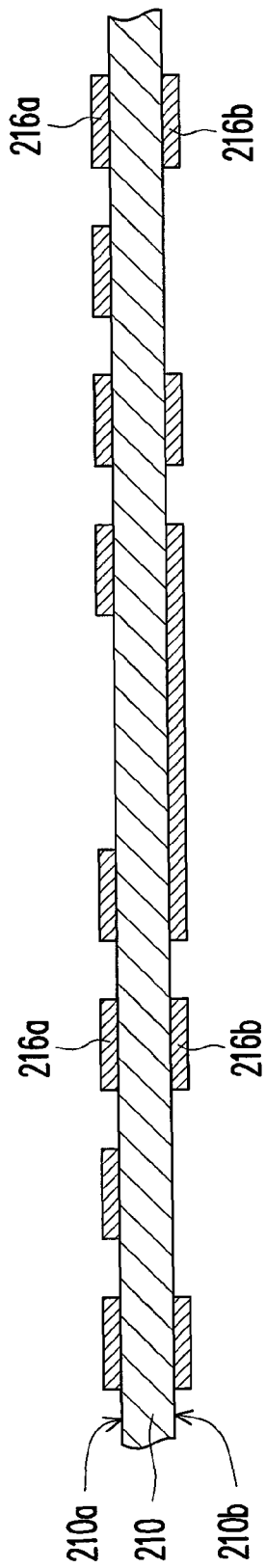

Next, referring to the FIG. 1C, the first patterned photoresist layer 214a and the second patterned photoresist layer 214b are removed simultaneously and the first metal layer 216a and the second metal layer are remained on the upper surface 210a and the lower surface 210b of the substrate 210 respectively.

Figure 1D:
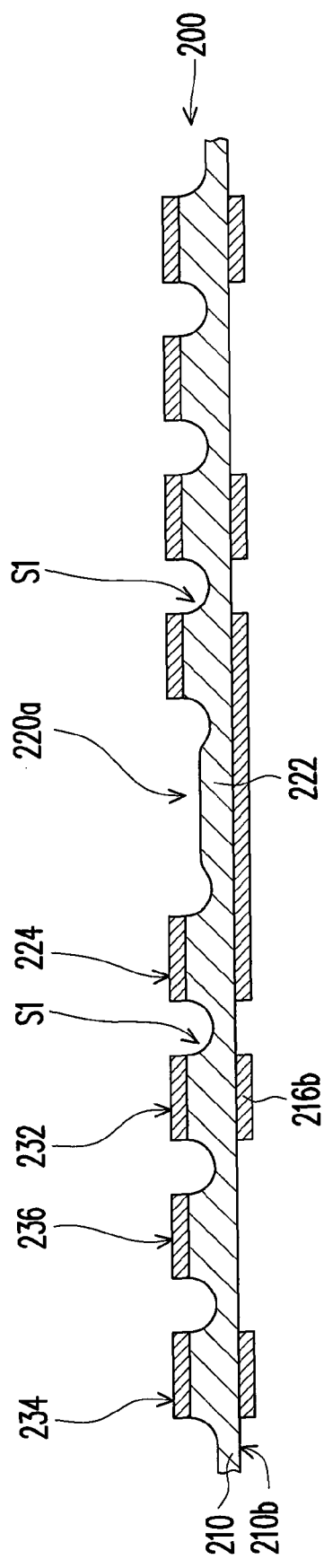

Next, referring to the FIG. 1D, an etching process is performed to remove a portion of the substrate 210 by using the first metal layer 216a as an etching mask, so as to form at least an accommodating cavity 220a and a plurality of first openings S1. So far, the carrier 200 is roughly formed following the formation of the first metal layer 216a, the second metal layer 216b and patterning the substrate 210.

In detail, the accommodating cavities 220a has a central portion 222 and a peripheral portion 224 disposed around the central portion 222. Defined by the openings S1, a plurality of first inner leads 232, a plurality of second inner leads 234 and at least a third inner lead 236 are formed. The first inner leads 232 are disposed surrounding the peripheral portion 224. The second inner leads 234 are disposed surrounding the first inner leads 232. The third inner leads 236 are disposed between the first inner leads 232 and the second inner leads 234. Noted that, the peripheral portion 224 can function as the ground ring.

Next, referring to the FIG. 1E, at least a chip 300 is provided to the central portion 222 of each accommodating cavity 220a with an adhesive layer 700 in-between. The bonding force between the chips 300 and the central portions 222 can be increased through the adhesive layers 700 disposed between the chips 300 and the central portion 222 of the accommodating cavities 220a.

Next, referring to the FIG. 1F, a plurality of wires 400 and at least a jumper 500 are provided. In the present embodiment, the wires 400 are disposed between the chips 300, the ground ring 224, the first inner leads 232 and the third inner leads 236. In detail, one end of the wires 400 is soldered on the chips 300, and the other end of the wires 400 is soldered on the ground rings 224, the first inner leads 232 and the third inner leads 236. In other words, the chips 300 are electrically connected to the ground rings 224, the first inner leads 232 and the third inner leads 236 through the wires 400.

The jumpers 500 disposed between the third inner leads 236 and the second inner leads 234 electrically connect the chips 300 and the second inner leads 234. The material of the jumper 500 can be different from the material of the wires 400. For example, the material of the jumper 500 can be selected from gold, copper, nickel, palladium or alloys thereof, while the material of the wire 400 can be gold. The chips 300 are electrically connected to the third inner leads 236 through the wires 400, and the chips 300 are electrically connected further to the second inner leads 234 through the jumpers 500. The design of the third inner leads 236 and the jumpers 500 can replace direct long wires and avoid the problems caused by wire sweeps or cross wires.

Figure 1G:
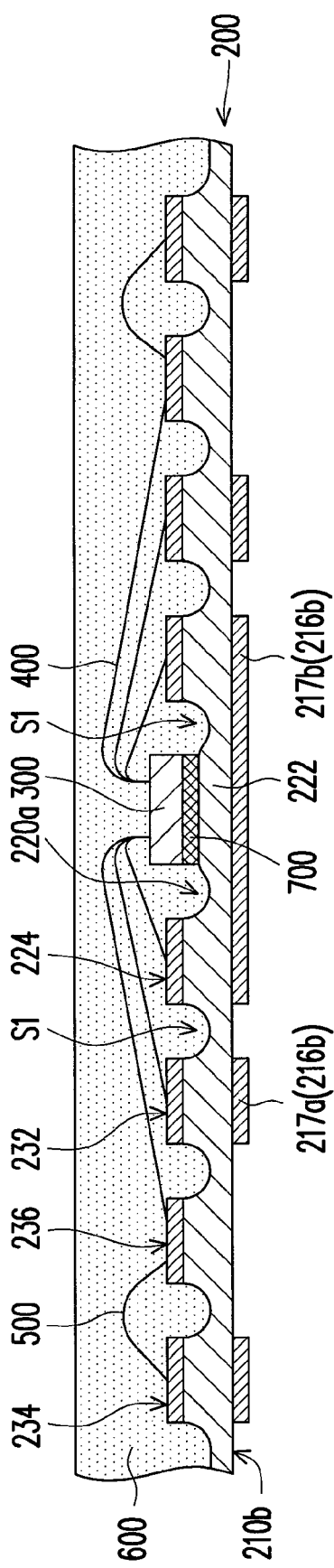

Next, referring to the FIG. 1G, a molding compound 600 is formed to encapsulate the chips 300, the wires 400, the jumpers 500, the first inner leads 232, the second inner leads 234, the ground ring 224 and the third inner leads 236, and fill the accommodating cavities 220a and the first openings S1.

Figure 1H:
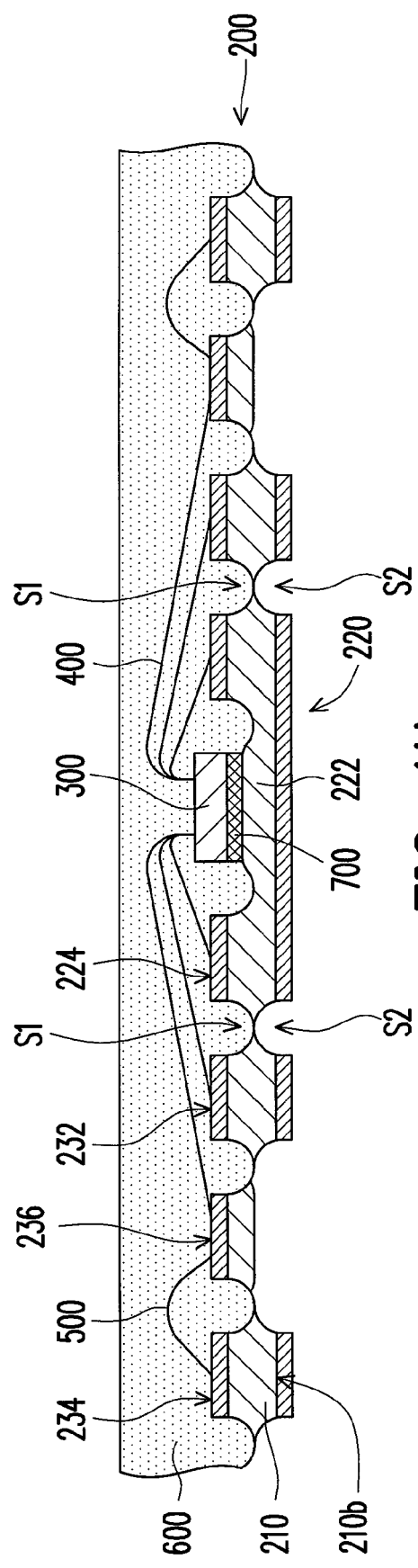

Then, referring to the FIG. 1H, an etching process is performed toward the lower surface 210b of the carrier 200 to remove the exposed portion of the substrate 210, so that the carrier 200 is etched through to expose the molding compound 600 filled inside the first openings S1 and simultaneously form a plurality of second openings S2. The first inner leads 232, the second inner leads 234 and the third inner leads 236 are electrically isolated from each other through the etching. Besides, during the etching process on the lower surface 210b of the carrier 200 to form the second openings S2, a die pad 220 including the central portion 222 and the peripheral portion 224 is further defined by the openings S2 of the carrier 200. The die pad 220 is surrounded by the first leads 232 but is isolated from the first leads 232 through the second openings S2.

In detail, in the present embodiment, the etching process is performed toward the lower surface 210b of the carrier 200, so as to form the second openings S2. Furthermore, as the substrate 210 corresponding to the third inner leads 236 is not covered by the second metal layer 216b, the substrate 210 corresponding to the third inner leads 236 is removed through the etching process. The third inner lead 236 functions as the floating terminal. The jumper described herein functions differently from the wires. In general, wires are used to connect the chip and other leads, while the jumper is used to connect the floating terminal and other leads, but is not connected to the chip. Therefore, a-QFN package structures 100 designed with one or more of the floating terminals 236 and the jumpers 500 are obtained.

In a word, the a-QFN package structure 100 in the present embodiment employs the floating terminals 236 and the jumpers 500 to replace direct long wires, so that the chip 300 can be electrically connected to the far leads (e.g. the second inner leads 234) through the jumpers 500 and the floating terminals 236. Therefore, the a-QFN package structure 100 in the present embodiment can avoid the possibility of wire sweep or cross wire concerns and enhance the product capability.

Figure 2A:
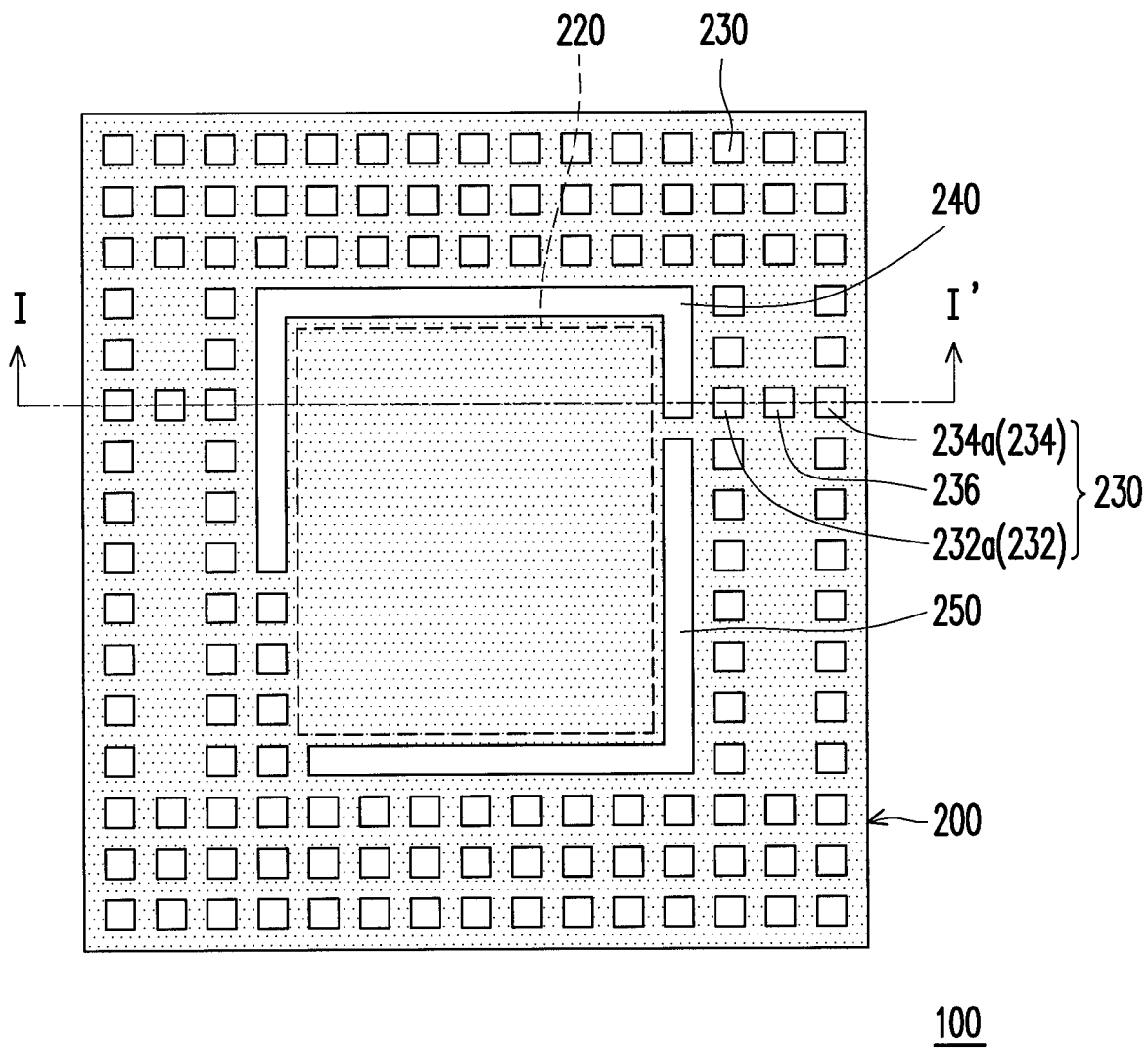
FIG. 2A is a top-side view illustrating an advanced quad flat non-leaded package structure according to an embodiment of the present invention.
Figure 2B:
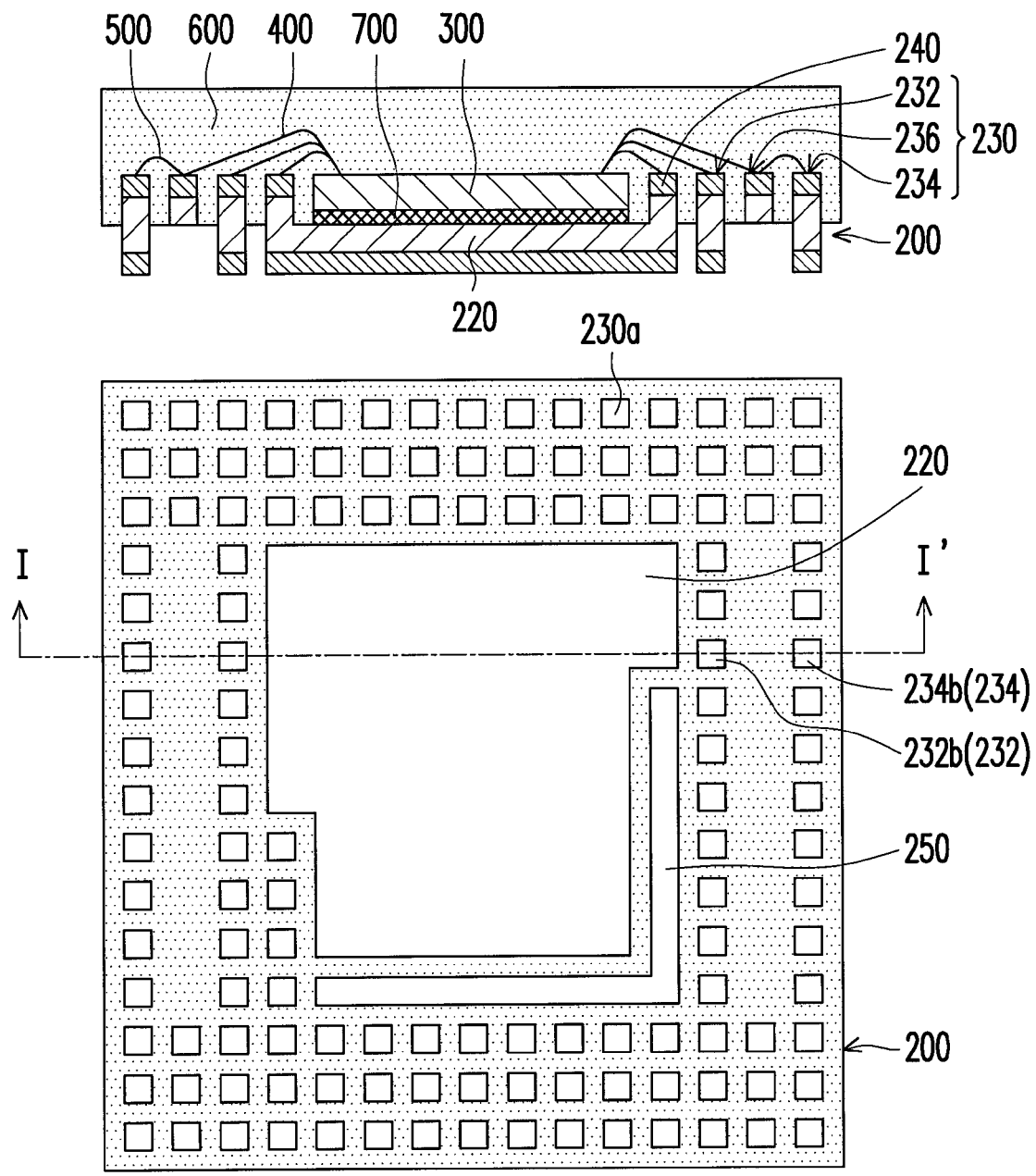
FIG. 2B is bottom-side view and a cross-sectional view along a line I-I' of the structure depicted in FIG. 2A.

FIG. 2A is a top-side view illustrating an advanced quad flat non-leaded package structure according to an embodiment of the present invention. FIG. 2B is bottom-side view and a cross-sectional view along a line I-I' of the structure depicted in FIG. 2A. For the convenience of description, some of the elements are omitted in the FIG. 2A. Referring to FIGS. 2A and 2B, in the present embodiment, an advanced quad flat non-leaded (a-QFN) package structure 100 includes a carrier 200, a chip 300, a plurality of wires 400, and at least a jumper 500.

The carrier 200 in the present embodiment is, for example, a leadframe. In detail, the carrier 200 includes a die pad 220 and a plurality of leads 230. The leads 230 include a plurality of first leads 232, a plurality of second leads 234 and at least a floating terminal 236. In FIG. 2A, only two of the floating terminal 236 are schematically depicted. Specifically, the first leads 232 are disposed around the die pad 220 and each first lead 232 includes a first inner lead 232a and a first outer lead 232b. The second leads 234 are disposed around the first leads 232 and each second lead 234 includes a second inner lead 234a and a second outer lead 234b. The inner leads and the outer leads are defined by the molding compound; that is, the portions of the leads that are encapsulated by the molding compound are defined as the inner leads, while the outer leads are the exposed portions of the leads. The floating terminals 236 are disposed on the upper surface of the die pad 220 and located between the first inner leads 232a and the second inner leads 234a.

In more details, the die pad 220 in the present embodiment has as a rectangular shape. For instance, the leads 230 can be arranged along both sides of the die pad 220 or arranged in a ring around the die pad 220. The arrangement of the leads 230 can be, for example, an array, a single row, or multiple rows of the ring. In the present embodiment, the arrangement of the first leads 232 and the second leads 234 as illustrated in FIG. 2A are merely exemplificative. Besides, the material of the leads 230 comprises gold or palladium.

The wires 400 are arranged between the chip 300, the first leads 232 and the floating terminals 236. In detail, one end of the wires 400 is soldered on the chip 300, and the other end of the wires 400 is soldered on first inner leads 232a and the floating terminals 236. In other words, the chip 300 is electrically connected to the closer first leads 232 or the floating terminals 236 of the carrier 200 through the wires 400.

The jumpers 500 are disposed between the floating terminals 236 and the farther second leads 234. One end of the jumpers 500 is soldered on the floating terminals 236, and the other end of the jumpers 500 is soldered on second inner leads 234a. The chip 300 is electrically connected to the second leads 234 through the floating terminals 236 and the jumpers 500.

In addition, the a-QFN package structure 100 in the present embodiment further includes a molding compound 600. The molding compound 600 encapsulates the chip 300, the wires 400, the jumpers 500, the first inner leads 232a, the second inner leads 234a, the floating terminals 236, and fills the gaps between the leads 230, while the first outer leads 232b, the second outer leads 234b and the bottom surface of the die pad 220 are exposed. A material of the molding compound 600 is, for example, epoxy resin or other applicable polymer material.

Further, in the present embodiment, to meet the electrical integration design requirement of the a-QFN package structure 100, the carrier 200 further includes at least a ground ring 240 and at least a power ring 250. The ground ring 240 is disposed between the first leads 232 and the die pad 220 and electrically connected to the chip 300 through wires 400. The power ring 250 is disposed between the first leads 232 and the die pad 220 and electrically connected to the chip 300 through wires 400. As the ground ring 240 is connected to the die pad 220, the die pad together with the ground ring may function as the ground plane. The power ring 250 is electrically isolated from the ground ring 240.

It should be noted that the position, the arrangement and the amount of the ground ring 240 and power ring 250 as shown in FIGS. 2A and 2B are merely exemplificative and should not be construed as limitations to the present invention.

In brief, the a-QFN package structure 100 in the present embodiment has the floating terminals 236 and the jumpers 500, so that the chip 300 can electrically connect to the farther leads (e.g. the second leads 234) through the floating terminals 236 and the jumpers 500. Hence, the design of the floating terminals 236 and the jumpers 500 can replace direct long wires. Therefore, the a-QFN package structure 100 in the present embodiment can avoid the possibility of long wire sweep or cross wire concerns and enhance the product capability.

FIGS. 3A through 3E are schematic cross-sectional views illustrating a manufacturing method of an advanced quad flat non-leaded package structure according to an embodiment of the present invention.

Figure 3A:
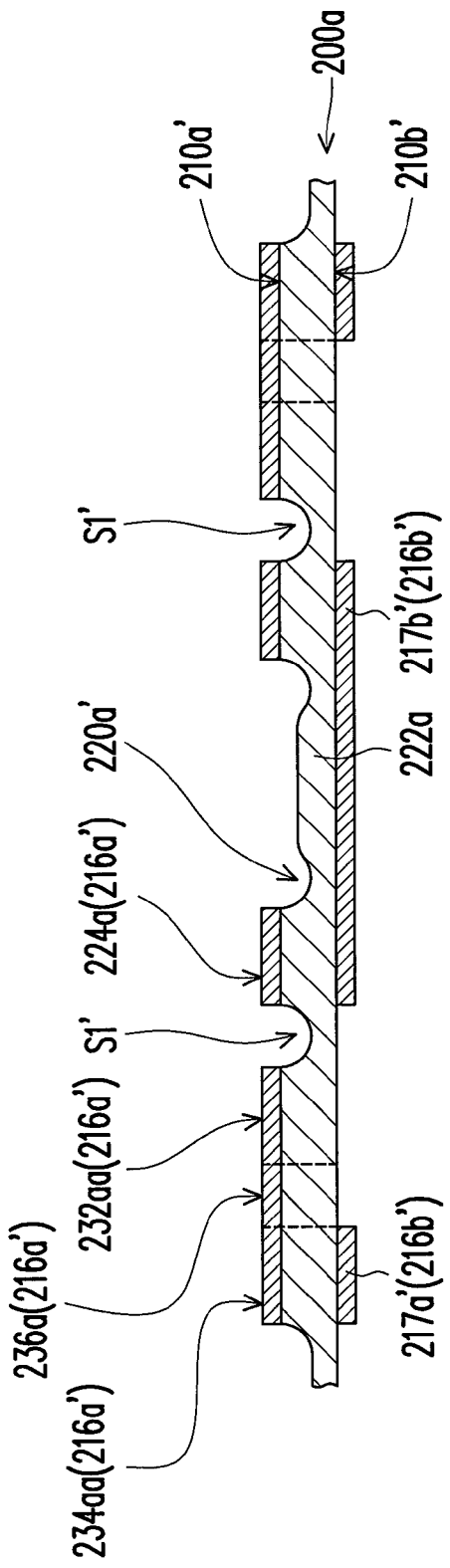

As shown in FIG. 3A, in the process for manufacturing the a-QFN package structure 100a according to the present embodiment, a carrier 200a is provided at first. The carrier 200a has at least an accommodating cavity 220a', a plurality of first openings S1', a first metal layer 216a' formed on an upper surface 210a' of the carrier 200a and a second metal layer 216b' formed on a lower surface 210b' of the carrier 200a. The first metal layer 216a' is not symmetrical to the second metal layer 216b'. In more detail, the second metal layer 216b' includes a plurality of first metal portion 217a' and a second metal portion 217b'. The first metal portions 217a' correspond to the subsequently to-be-formed second inner leads 234aa, and the second metal portion 217b' correspond to the subsequently to-be-formed die pad 220a (shown in FIG. 3E). Besides, the step of forming the carrier 200a is similar to those shown by FIGS. 1A through 1C, a relevant description of the process is not repeated herein.

In detail, each of the accommodating cavities 220a' has a central portion 222a and a peripheral portion 224a disposed around the central portion 222a. Referring to FIG. 3A, the first metal layer 216a' of the carrier 200a is defined into a plurality of first inner leads 232aa, a plurality of second inner leads 234aa and at least a connecting portion 236a by the first openings S1'. Specifically, the first inner leads 232aa are disposed close to or surrounding the peripheral portion 224a. The second inner leads 234aa are disposed in the vicinity of or surrounding the first inner leads 232aa. Each of the connecting portions 236a of the first metal layer 216a' is disposed between one of the first leads 232aa and one of the second inner leads 234aa.

Note that, each of the connecting portions 236a connects one first inner lead 232aa and one adjacent second inner lead 234aa. In the present embodiment, the peripheral portion 224a may function as the ground ring.

Figure 3B:
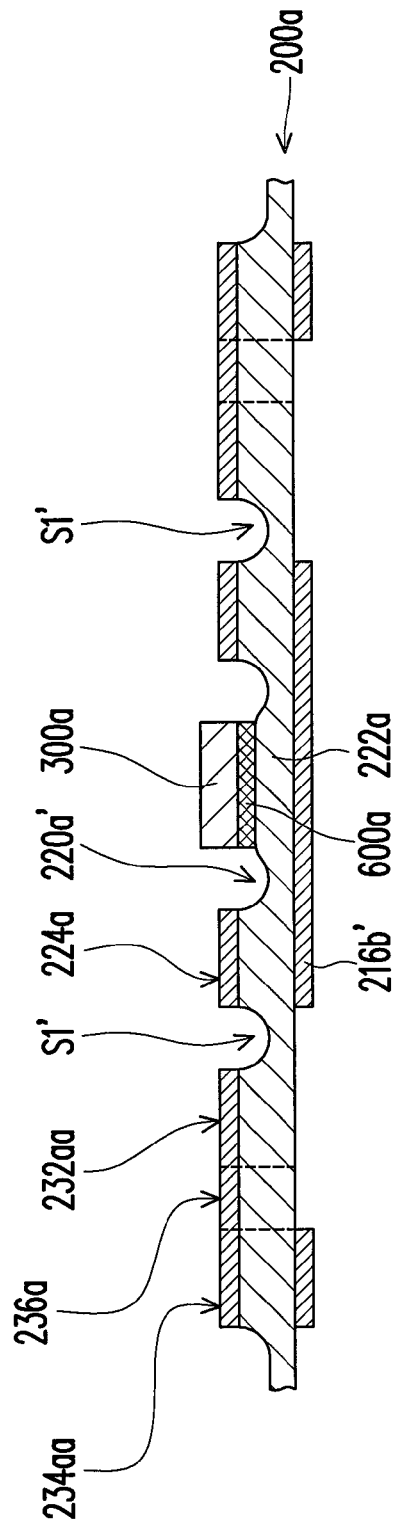

Next, referring to the FIG. 3B, at least a chip 300a is provided to the central portion 222a of the accommodating cavity 220a' with an adhesive layer 600a disposed between the chip 300a and the central portion 222a of the accommodating cavity 220a'.

Next, referring to the FIG. 3C, a plurality of wires 400a is formed. In the present embodiment, the wires 400a are disposed between the chip 300a, the ground ring 224a, and the first inner leads 232aa. The chip 300a is electrically connected to the ground ring 224a and the first inner leads 232aa through the wires 400a. Since each of the connecting portions 236a connects one first inner lead 232aa and one adjacent second inner lead 234aa, the chip 300a can be electrically connected to the second inner leads 234aa through the connecting portions 236a and the wires 400a. In other words, the design of the connecting portions 236a to connect two neighboring leads (e.g. first inner lead 232aa and second inner lead 234aa) can reduce the wire length.

Next, referring to the FIG. 3D, a molding compound 500a is formed to encapsulate the chips 300a, the wires 400a, the first inner leads 232aa, the second inner leads 234aa, the ground rings 224a, the connecting portions 236a, and filling the accommodating cavities 220a' and the first openings S1'.

Then, referring to the FIG. 3E, an etching process is performed to the lower surface 210b' of the carrier 200a to remove the exposed portion of the carrier 200a that is not covered by the second metal layer 216b' until the molding compound 500a is exposed and a plurality of second openings S2' is formed. The molding compound 500a filled in the first openings S1 is exposed through the second openings S2'. Therefore, the first leads 232a and the second leads 234a are electrically isolated from one another, except those connected by the connecting portions 236a. Moreover, exposed portions of the carrier 200a corresponding to the first inner lead 232a and the connecting portions 236a are also simultaneously removed during the etching process until the molding compound 500a inside the first openings S1' is exposed by the second openings S2. On the whole, the first and second leads are electrically isolated from one another through this etching process, except for those leads connected by the connecting portions. The etching rate and/or the thickness of the metal portions can be finely tuned for optimal performances.

Besides, during the etching process to form the second openings S2', the die pad 220a is simultaneously defined. The die pad 220a is surrounded by the first inner leads 232a and isolated from the first inner leads 232aa through the openings S1'/S2'. Finally, the a-QFN package structures 100a having the design of the connecting portions 236a are obtained.

As shown in FIG. 3E, for the first inner leads 232aa that are connected to the connecting portion 236a, their outer lead portions are removed. That is, those first leads 232a that are connected to the connecting portion 236a merely have the first inner leads 232aa. However, as later shown in FIG. 4A-4B, for most of the first leads 232a that are not connected by the connecting portions 236a, each of these first lead 232a includes a first inner lead 232aa and a first outer lead 232ab. Depending on the product requirements, it is possible to modify the design of the metal portions of the second metal layer to decide whether the outer lead portions of the first/second leads should be remained or removed.

The a-QFN package structure 100a in the present embodiment has the connecting portions 236a to connect two neighbouring leads (e.g. first inner lead 232aa and second inner lead 234aa), so that length of the wires 400a can be reduced. Therefore, the a-QFN package structure 100a in the present embodiment can avoid the possibility of long wire sweep or cross wire concerns and enhance the product capability.

Figure 4A:
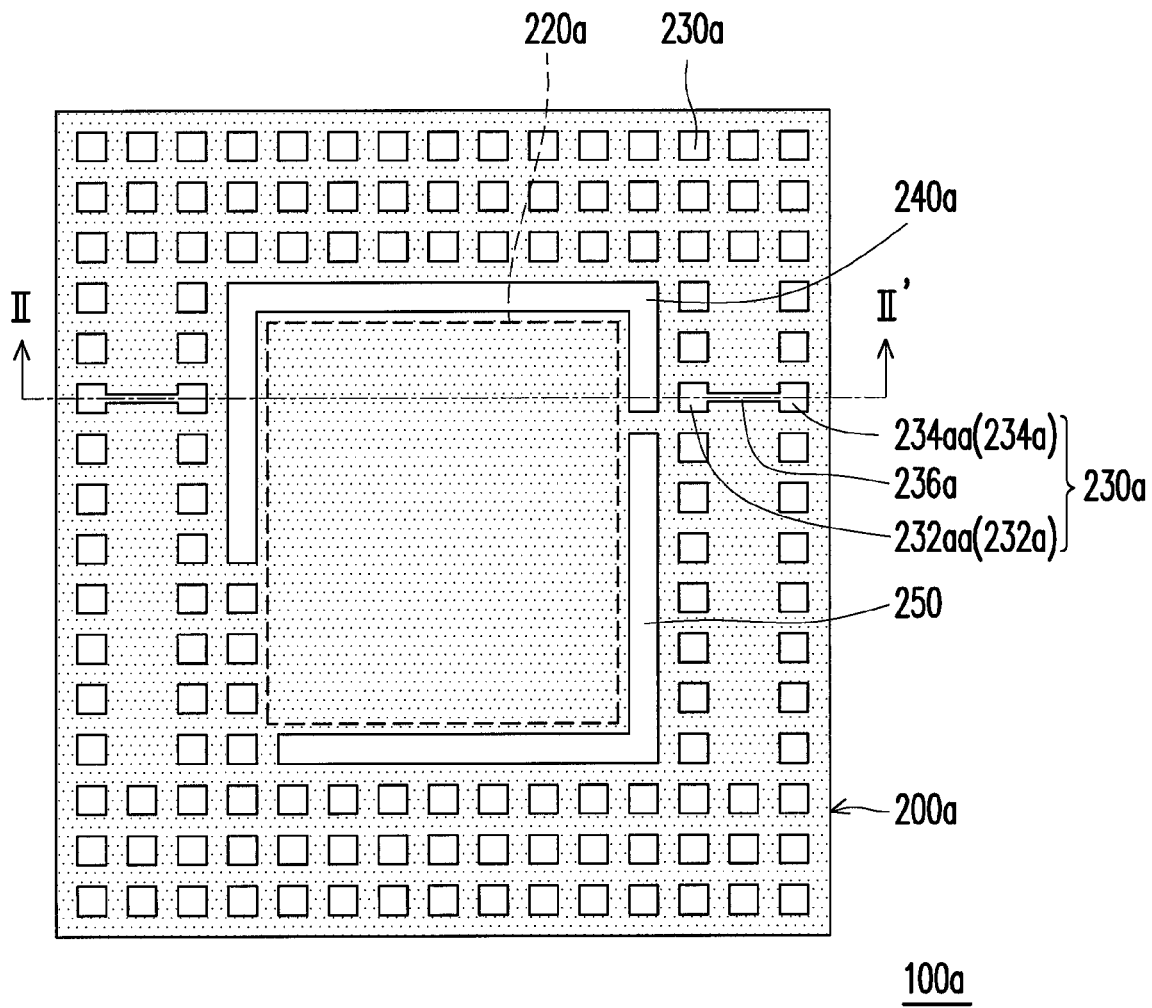
FIG. 4A is a top-side view illustrating an advanced quad flat non-leaded package structure according to another embodiment of the present invention.
Figure 4B:
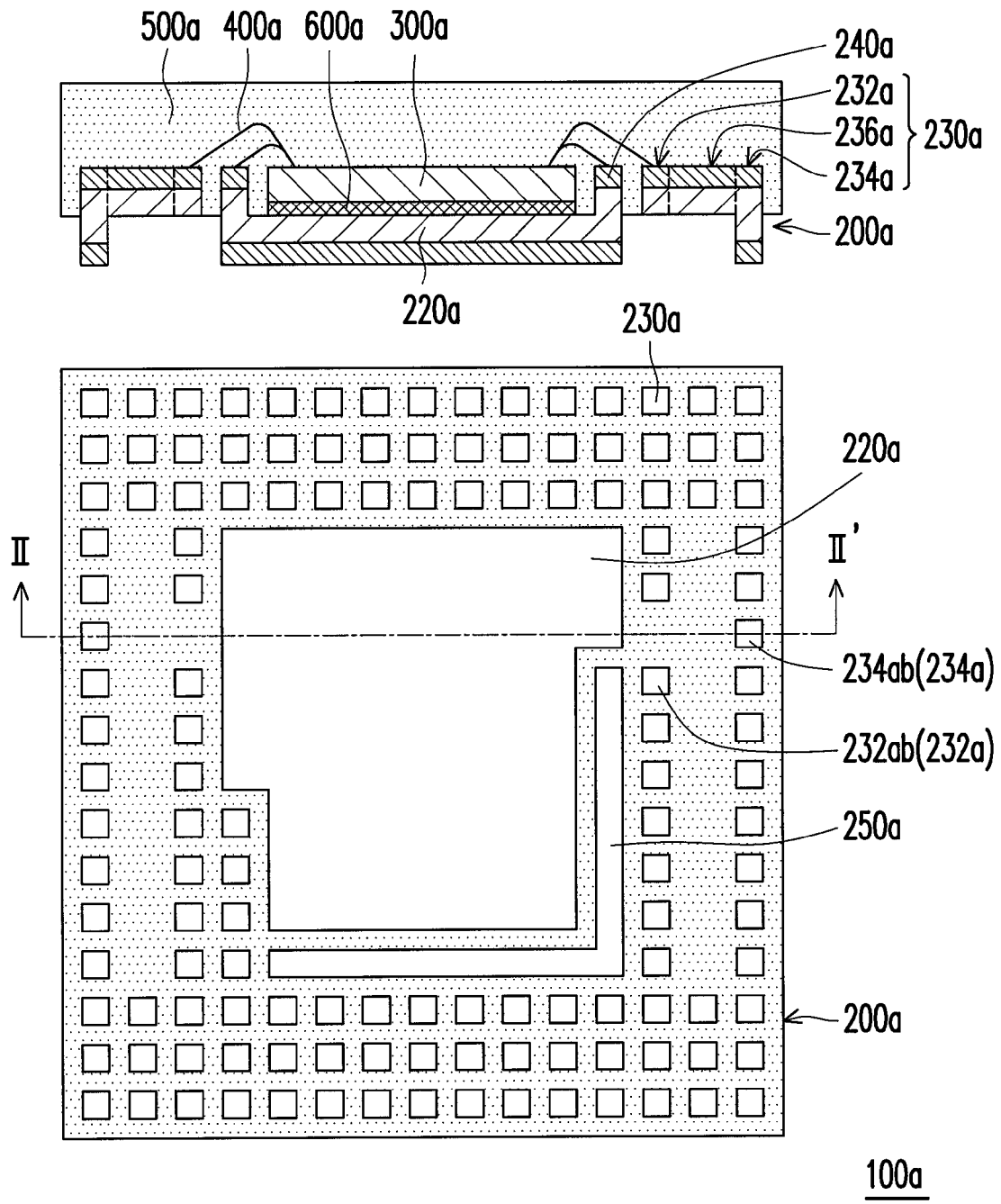
FIG. 4B is bottom-side view and a cross-sectional view along a line II-II' of the structure depicted in FIG. 4A.

FIG. 4A is a top-side view illustrating an advanced quad flat non-leaded package structure according to another embodiment of the present invention. FIG. 4B is bottom-side view and a cross-sectional view along a line II-II' of the structure depicted in FIG. 4A. For the convenience of description, some of the elements are omitted in the FIG. 4A. Referring to FIGS. 4A and 4B, in the present embodiment, an advanced quad flat non-leaded (a-QFN) package structure 100a includes a carrier 200a, a chip 300a and a plurality of wires 400a.

The carrier 200a in the present embodiment is, for example, a leadframe. In detail, the carrier 200a includes a die pad 220a and a plurality of leads 230a. The leads 230a include a plurality of first leads 232a, a plurality of second leads 234a and at least a connecting portion 236a. In general, for most first leads 232a, each first leads 232a includes a first inner lead 232aa and a first outer leads 232ab. For the first leads 232a that are connected to the connecting portions 236a, the first leads may only include first inner leads 232aa, without the outer lead portions. For the second leads 234a, each second lead 234a includes a second inner lead 234aa and a second outer lead 234ab. In FIG. 4A, only two of the connecting portions 236a are schematically depicted. Each of the connecting portions 236a is disposed between one of the first inner leads 232aa and one of the second inner leads 23aa.

Since the material of the leads 230a and the shape of the die pad 220a are similar to the foregoing embodiment depicted in FIGS. 1A and 1B, and have been described above, the detailed description is not repeated.

The chip 300a is disposed on the die pad 220a. The wires 400a are disposed between the chip 300a and the leads 230a. In the present embodiment, one end of the wires 400a is soldered on the chip 300a, and the other end of the wires 400a is soldered on the connecting portion 236a. However, attributed to the connecting portion 236a there-between, the wire 400a can be connected to either the closer first leads 232a or any location of the connecting portion 236a. In general, the chip 300a is electrically connected to the leads 230a through the wires 400a.

In addition, the a-QFN package structure 100a in the present embodiment further includes a molding compound 500a. The molding compound 500a encapsulates the chip 300a, the wires 400a, and fills the gaps between the leads 230a. In other words, the molding compound 500a encapsulates the first inner leads 232aa, the second inner leads 234aa and the connecting portion 236a, while the first outer leads 232ab and the second outer leads 234ab are exposed.

Further, the carrier 200a in the present embodiment further includes at least a ground ring 240a and at least a power ring 250a for electrical integration design. Since the position, the arrangement and the amount of the ground ring 240a and the power ring 250a are similar to the foregoing embodiment depicted in FIGS. 2A and 2B, as described above, the detailed description is not repeated. Besides, the a-QFN package structure 100a in the present embodiment further includes an adhesive layer 600a. The adhesive layer 600a is disposed between the chip 300a and the die pad 220a for increasing a bonding force between the chip 300a and the die pad 220a.

In brief, the a-QFN package structure 100a in the present embodiment has the connecting portions 236a, so that the chip 300a can electrically connect to the farther leads (e.g. the second leads 234a) through the connecting portions 236a between the first inner leads 232aa and the second inner leads 234aa. Hence, the design of the connecting portions 236a connecting two neighbouring leads can reduce the length of the wires 400a. Therefore, the a-QFN package structure 100a in the present embodiment can avoid the possibility of long wire sweep or cross wire concerns and enhance the product capability.

The above described floating terminal or the connecting portions of the a-QFN package structures can be considered as the embedded lead portion(s), which is mainly embedded with the molding compound of the a-QFN package structures except its bottom surface is exposed from the molding compound. The embedded lead portion (i.e. the floating terminal or the connecting portion) can provide better electrical connection and result in improved reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor package, comprising:
   a carrier having a die pad, and a plurality of leads, wherein the leads include a plurality of first leads disposed around the die pad, a plurality of second leads disposed around the first leads, and a connecting portion that directly connects one of the plurality of first leads with one of the plurality of second leads;
   a chip, disposed on the die pad;
   a wire that connects the chip to at least one of the plurality of first leads; and
   a molding compound, encapsulating the chip, the wire, and portions of the first leads, the second leads, and the connecting portion;
   wherein:
   the connecting portion has a lower surface at least a portion of which is substantially coplanar with a lower surface of the one of the plurality of first leads;
   a lower surface of the one of the plurality of first leads is substantially coplanar with a lower surface of the molding compound; and
   the one of the plurality of second leads protrudes from a lower surface of the molding compound.

2. The semiconductor package as claimed in claim 1, wherein a material of the connecting portion is different from that of the wire.

3. The semiconductor package as claimed in claim 1, wherein the carrier further comprises a ground ring electrically connected to the chip.

4. The semiconductor package as claimed in claim 3, wherein the carrier further comprises a power ring electrically connected to the chip, wherein the power ring is electrically isolated from the ground ring.

5. The semiconductor package as claimed in claim 1, wherein the chip is electrically connected to the one of the plurality of second leads through the wire and the connecting portion.

6. The semiconductor package as claimed in claim 1, wherein at least a portion of the die pad protrudes from the lower surface of the molding compound.

7. A semiconductor package, comprising:
   a carrier having a die pad, and a plurality of leads, wherein the leads include a plurality of first leads disposed around the die pad, a plurality of second leads disposed around the first leads, and a connecting portion that directly connects one of the plurality of first leads with one of the plurality of second leads;
   a chip, disposed on the die pad;
   a wire that connects the chip to at least one of the plurality of first leads; and
   a molding compound, encapsulating the chip, the wire, and portions of the first leads, the second leads, and the connecting portion;
   wherein:
   the connecting portion has a lower surface at least a portion of which is substantially coplanar with a lower surface of the one of the plurality of first leads; and
   the connecting portion protrudes from a lower surface of the molding compound.

8. The semiconductor package as claimed in claim 7, wherein the at least a portion of the lower surface of the connecting portion is substantially coplanar with a lower surface of the molding compound.

9. The semiconductor package as claimed in claim 7, wherein the chip is electrically connected to the one of the plurality of second leads through the connecting portion.

10. The semiconductor package as claimed in claim 7, wherein the carrier further comprises a ground ring electrically connected to the chip.

11. The semiconductor package as claimed in claim 10, wherein the carrier further comprises a power ring electrically connected to the chip, wherein the power ring is electrically isolated from the ground ring.

12. The semiconductor package as claimed in claim 7, wherein at least a portion of the die pad protrudes from the lower surface of the molding compound.

13. A semiconductor package, comprising:
   a die pad;
   a die disposed on the die pad;
   a plurality of first leads circumscribing the die pad;
   a plurality of second leads circumscribing the plurality of first leads;
   a connecting portion that directly connects one of the plurality of first leads with one of the plurality of second leads; and
   a molding compound having a lower surface, wherein the one of the plurality of second leads protrudes from the lower surface of the molding compound;
   wherein a lower surface of the one of the plurality of first leads is substantially coplanar with the lower surface of the molding compound and a portion of a lower surface of the connecting portion, and a remaining portion of the lower surface of the connecting portion protrudes from the lower surface of the molding compound.

14. The semiconductor package as claimed in claim 13, wherein at least a portion of the die pad protrudes from the lower surface of the molding compound.

15. The semiconductor package as claimed in claim 13, wherein the remaining portion of the lower surface of the connecting portion is curved.

16. The semiconductor package as claimed in claim 13, wherein an upper surface of the one of the plurality of first leads, an upper surface of the one of the plurality of second leads, and an upper surface of the connecting portion are substantially coplanar.

17. The semiconductor package as claimed in claim 13, wherein the die is electrically connected to the one of the plurality of second leads through the connecting portion.

18. The semiconductor package as claimed in claim 13, further comprising a wire electrically connected to the one of the plurality of first leads, and wherein:
   the connecting portion is a jumper that extends between the one of the plurality of first leads and the one of the plurality of second leads; and
   a material of the jumper is different from that of the wire.

19. The semiconductor package as claimed in claim 13, further comprising a ground ring electrically connected to the die.

20. The semiconductor package as claimed in claim 19, further comprising a power ring electrically connected to the die, wherein the power ring is electrically isolated from the ground ring.

* * * * *